(12) United States Patent
Chiba

(10) Patent No.: US 12,189,115 B2
(45) Date of Patent: Jan. 7, 2025

(54) MANUFACTURING METHOD AND OPTICAL DEFLECTOR

(71) Applicant: STANLEY ELECTRIC CO., LTD., Tokyo (JP)

(72) Inventor: Hirofumi Chiba, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 519 days.

(21) Appl. No.: 17/617,874

(22) PCT Filed: May 22, 2020

(86) PCT No.: PCT/JP2020/020384
§ 371 (c)(1),
(2) Date: Dec. 9, 2021

(87) PCT Pub. No.: WO2020/255627
PCT Pub. Date: Dec. 24, 2020

(65) Prior Publication Data
US 2022/0308336 A1     Sep. 29, 2022

(30) Foreign Application Priority Data
Jun. 17, 2019   (JP) ................................. 2019-111955

(51) Int. Cl.
*G02B 26/08*     (2006.01)
*H10N 30/057*    (2023.01)
(Continued)

(52) U.S. Cl.
CPC ....... *G02B 26/0858* (2013.01); *H10N 30/057* (2023.02); *H10N 30/082* (2023.02); *H10N 30/20* (2023.02)

(58) Field of Classification Search
CPC .............. G02B 26/0858; G02B 26/101; H10N 30/057; H10N 30/082; H10N 30/20
See application file for complete search history.

(56) References Cited

U.S. PATENT DOCUMENTS

2012/0113492 A1   5/2012   Nakazono et al.
2013/0084661 A1   4/2013   Yasuda
(Continued)

FOREIGN PATENT DOCUMENTS

CN    104765144 A    7/2015
EP    3096367 A1     11/2016
(Continued)

OTHER PUBLICATIONS

Extended European Search Report (EESR) dated Jun. 20, 2023, issued in counterpart European Application No. 20827180.9.
(Continued)

*Primary Examiner* — Euncha P Cherry
(74) *Attorney, Agent, or Firm* — Holtz, Holtz & Volek PC

(57) ABSTRACT

A manufacturing method for an optical deflector, in which a piezoelectric film layer having a uniform film thickness is formed on a substrate layer, includes forming a cavity to open to a $SiO_2$ layer side in a forming region of an outside piezoelectric actuator by etching an SOI wafer from the $SiO_2$ layer side, covering an exposed surface of the cavity with a $SiO_2$ layer, and joining the $SiO_2$ layer of the SOI wafer and a support layer of an SOI wafer to manufacture an SOI wafer in which the cavity is enclosed. Next, after a recess is formed on a back side of the SOI wafer, anisotropic dry etching is carried out from the back side in a depth direction of the recess to remove the $SiO_2$ layer.

7 Claims, 11 Drawing Sheets

(51) Int. Cl.
*H10N 30/082*   (2023.01)
*H10N 30/20*    (2023.01)

(56) References Cited

U.S. PATENT DOCUMENTS

| | | |
|---|---|---|
| 2015/0338644 A1 | 11/2015 | Yasuda |
| 2016/0341956 A1 | 11/2016 | Yasuda |
| 2018/0088321 A1 | 3/2018 | Maruyama et al. |
| 2018/0180871 A1 | 6/2018 | Costantini et al. |
| 2020/0209616 A1* | 7/2020 | Takahashi .......... G02B 26/0858 |

FOREIGN PATENT DOCUMENTS

| | | |
|---|---|---|
| JP | 2015219516 A | 12/2015 |
| JP | 2017074625 A | 4/2017 |
| JP | 2017211576 A | 11/2017 |
| WO | 2006011692 A1 | 2/2006 |
| WO | 2010122751 A1 | 10/2010 |

OTHER PUBLICATIONS

Japanese Office Action (and an English language translation thereof) dated Jun. 20, 2023, issued in counterpart Japanese Application No. 2019-111955.

International Search Report (ISR) (and English translation thereof) dated Jun. 30, 2020 issued in International Application No. PCT/JP2020/020384.

Written Opinion dated Jun. 30, 2020 issued in International Application No. PCT/JP2020/020384.

* cited by examiner

FIG.2A
| SOI FILM THICKNESS | RESONANCE IN HORIZONTAL DIRECTION | | NON-RESONANCE IN VERTICAL DIRECTION | |
|---|---|---|---|---|
| | DRIVE VOLTAGE [Vpp] | RESONANCE FREQUENCY [Hz] | DRIVE VOLTAGE [Vpp] | SWING ANGLE [deg] |
| 40.0 um | 5 | 29471 | 50 | 5.6 |
| 42.5 um | | 31997 | | 4.9 |
| 45.0 um | | 33158 | | 4.4 |
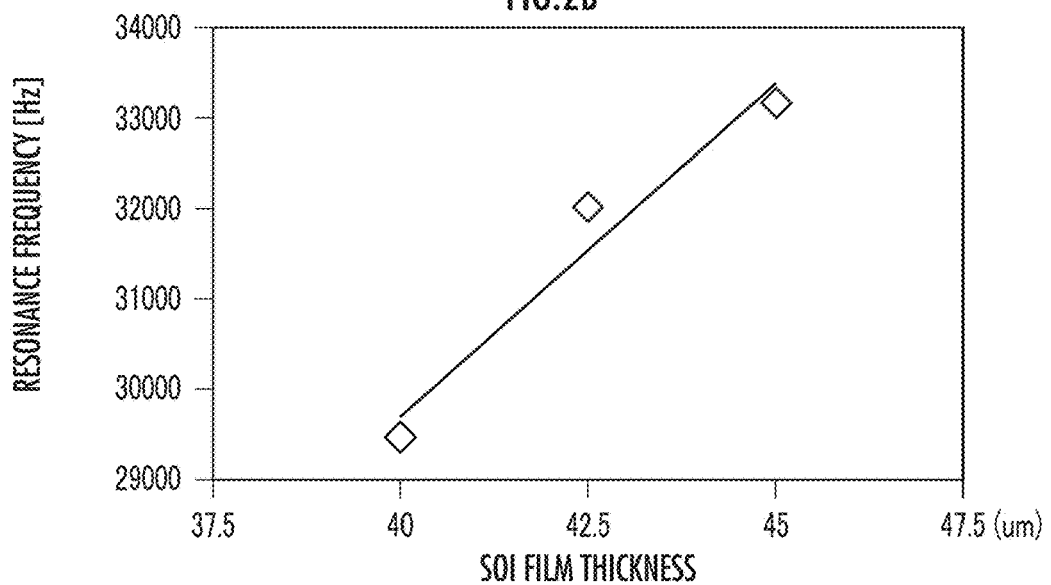
FIG.2B
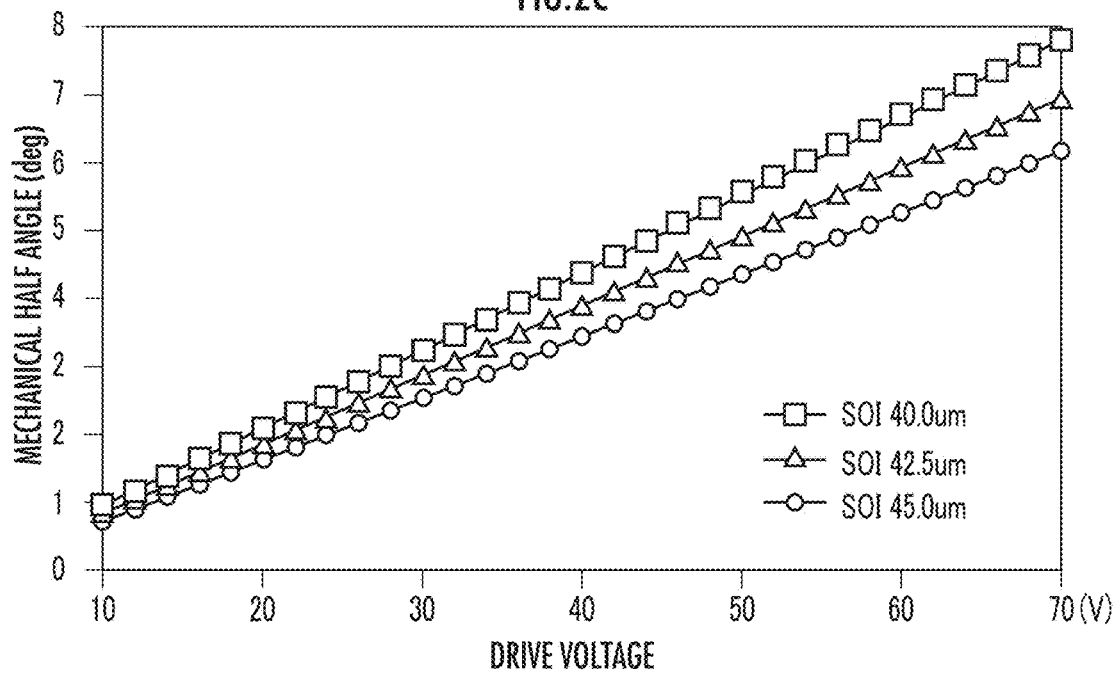
FIG.2C

MANUFACTURING METHOD AND OPTICAL DEFLECTOR

TECHNICAL FIELD

The present invention relates to a manufacturing method for an optical deflector for MEMS (Micro Electro Mechanical Systems), and the optical deflector.

BACKGROUND ART

There are known optical deflectors for MEMS (Patent Literatures 1 and 2).

An optical deflector of Patent Literature 1 includes a mirror unit, a movable support unit, a fixed support unit, first piezoelectric actuators interposed between the mirror unit and the movable support unit to turn the mirror unit reciprocally about a first rotation axis at a resonance frequency, and second piezoelectric actuators interposed between the movable support unit and the fixed support unit to turn the mirror unit reciprocally about a second rotation axis intersecting the first rotation axis at a non-resonant frequency lower than the resonance frequency.

In the optical deflector of Patent Literature 1, the first piezoelectric actuators and the second piezoelectric actuators use a SOI (Silicon on Insulator) active layer as a common substrate layer. Then, the surface of the active layer of the second piezoelectric actuators is dug down to be below the first piezoelectric actuators. In other words, the thickness of the substrate layer is so made that the second piezoelectric actuators are thinner than the first piezoelectric actuators. As a result, despite the optical deflector manufactured from the same SOI, the swing angle of the mirror unit about the second rotation axis increases while increasing the resonance frequency of the mirror unit about the first rotation axis.

Patent Literature 2 discloses a manufacturing method for an SOI Si wafer used in the manufacture of MEMS including a mirror part and piezoelectric actuators. According to the manufacturing method, multiple narrow trenches with different depths depending on the position are formed on the back side of an active layer as a Si layer. Next, thermal oxidation is made between narrow trenches to form a trench obtained by coupling the trenches in order to form a sacrificial layer on the back side of the active layer including the inside of the trench. Next, the sacrificial layer side of the active layer is pasted on the surface side of a support layer as another Si layer to complete the SOI.

CITATION LIST

Patent Literatures

Patent Literature 1: Japanese Patent Application Laid-Open No. 2017-211576
Patent Literature 2: Japanese Patent Application Laid-Open No. 2017-074625

SUMMARY OF INVENTION

Technical Problem

In the manufacturing method for the MEMS optical deflector, there is a need to form a piezoelectric film layer over the entire substrate layer in order to manufacture the piezoelectric actuators. In the process, the quality of the piezoelectric film layer will be deteriorated unless the film thickness of the piezoelectric film layer is uniform. Therefore, the piezoelectric film layer must be formed on a plane with low roughness.

In the optical deflector of Patent Literature 1, a piezoelectric film layer is formed on the surface side where the active layer is shaven down. When the active layer is etched, the surface becomes rough.

In the SOI of Patent Literature 2, the active layer has trenches on the back side, and the piezoelectric film layer is formed on the surface of the active layer on the side where no trenches are formed. Further, a mirror is arranged in a surface area having the trenches on the back side of the active layer, whereas piezoelectric elements are arranged in a surface area without trenches on the back side.

A MEMS optical deflector of Patent Literature 2 is a one-axis optical deflector because of not including a movable support part.

On the other hand, in a two-axis optical deflector, a movable support part is interposed between the first piezoelectric actuators and the second piezoelectric actuators. Therefore, when the resonance frequency of a mirror part about the first rotation axis is increased or the substrate layer of the second piezoelectric actuators is made thinner to increase the swing angle about the second rotation axis, the power of the movable support part to support the mirror part is reduced and hence the movable support part tends to cause abnormal vibration.

It is an object of the present invention to provide a manufacturing method for an optical deflector, which can form a piezoelectric film layer having a uniform thickness on a substrate layer despite etching of the substrate layer and can suppress abnormal vibration of a movable support part, and the optical deflector manufactured by the manufacturing method.

Solution to Problem

A manufacturing method of the present invention is a manufacturing method for an optical deflector including a mirror part, a movable support part, a fixed support part, first piezoelectric actuators interposed between the mirror part and the movable support part to turn the mirror part reciprocally about a first rotation axis at a resonance frequency, and second piezoelectric actuators interposed between the movable support part and the fixed support part to turn the mirror part reciprocally about a second rotation axis intersecting the first rotation axis at a non-resonant frequency lower than the resonance frequency, the manufacturing method including:

a first process in which etching regions and non-etching regions are set on a surface of a first Si wafer on a second $SiO_2$ side, where the first Si wafer has a laminated structure in which a first $SiO_2$ layer, first Si and second $SiO_2$ layers are arranged in order in a thickness direction, at least forming regions of the second piezoelectric actuators are included in the etching regions, at least forming regions of the movable support part are included in the non-etching regions, and etching is carried out only on the etching regions of the first Si wafer from the second $SiO_2$ side to form cavities in the first Si layer to open to the second $SiO_2$ side;

a second process of covering an exposed surface of the cavities with a third $SiO_2$ layer;

a third process in which a surface of a second Si wafer on a second Si layer side, where the second Si wafer has a laminated structure of a fourth $SiO_2$ layer and the second Si layer in the thickness direction, is joined to the surface of the first Si wafer on the second SiO$_2$ layer side to form a third Si wafer with the cavities enclosed therein;

a fourth process of laminating a lower electrode layer, a piezoelectric film layer, and an upper electrode layer over an entire surface of the third Si wafer on the first SiO$_2$ layer side as a laminated structure layer of piezoelectric actuators;

a fifth process in which anisotropic dry etching is carried out from a surface side of the third Si wafer to a depth of reaching the surface side of the second SiO$_2$ layer to form the first piezoelectric actuators and the second piezoelectric actuators;

a sixth process in which etching is carried out from a back side of the third Si wafer to a depth of reaching a back side of the second SiO$_2$ layer to form, on the back side of the third Si wafer, a recess surrounded by an inner wall of the fixed support part; and a seventh process in which anisotropic dry etching is carried out from the back side of the third Si wafer in a depth direction of the recess to remove the second SiO$_2$ layer and the third SiO$_2$ layer.

According to the present invention, the piezoelectric film layer is formed on the first SiO$_2$ layer of the third Si wafer where etching is not carried out. As a result, a piezoelectric film layer having a uniform film thickness can be formed.

According to the present invention, the first Si layer of the third Si wafer becomes a substrate layer common to respective elements of the optical deflector. Then, forming regions of the second piezoelectric actuators are etching regions, and forming regions of the movable support part are non-etching regions. This makes the substrate layer of the second piezoelectric actuators thinner to increase flexibility. Further, the substrate layer of the movable support part is made thicker to increase the rigidity thereof. Thus, abnormal vibration of the movable support part can be suppressed while increasing the swing angle of the mirror part about the second rotation axis.

Preferably, the manufacturing method of the present invention is such that a forming region of the mirror part and forming regions of the first piezoelectric actuators are included in the etching regions in the first process.

According to this structure, since the weight of the mirror part and the first piezoelectric actuators is reduced, the abnormal vibration of the movable support part due to the resonance of the mirror part can be further suppressed.

Preferably, the manufacturing method of the present invention is such that, in the first process, a forming region of the mirror part is included in the etching regions, and forming regions of the first piezoelectric actuators are included in the non-etching regions.

According to this structure, the swing angle of the mirror part about the first rotation axis can be increased.

Preferably, the manufacturing method of the present invention is such that, in the first process, forming regions of the first piezoelectric actuators are included in the etching regions, and a forming region of the mirror part is included in the non-etching regions.

According to this structure, since the thickness of the mirror part is increased, the mirror surface of the mirror part can be suppressed from being distorted.

Preferably, the manufacturing method of the present invention is such that, in the first process, a forming region of the mirror part and forming regions of the first piezoelectric actuators are included in the non-etching regions.

According to this structure, the rigidity of the mirror part can be increased to suppress the mirror part from being distorted. Further, the rigidity of the first piezoelectric actuators can be increased to increase the resonance frequency of the mirror part about the first rotation axis.

Preferably, the manufacturing method of the present invention is such that the sixth process includes etching, after the fifth process, from the back side of the third Si wafer by excluding at least rib forming regions of the mirror part and the movable support part to form ribs of the second Si layer on back sides of the mirror part and the movable support part.

According to this structure, the rigs of the second Si layer are formed on the back sides of the mirror part and the movable support part. Thus, the abnormal vibration of the movable support part can be suppressed while suppressing the mirror pan from being distorted.

An optical deflector of the present invention is an optical deflector including a mirror part, a movable support part, first piezoelectric actuators interposed between the mirror part and the movable support part to turn the mirror part reciprocally about a first rotation axis at a resonance frequency, a fixed support part placed more away from the mirror part than the movable support part, and second piezoelectric actuators interposed between the movable support part and the fixed support part to turn the mirror part reciprocally about a second rotation axis intersecting the first rotation axis at a non-resonant frequency lower than the resonance frequency, the optical deflector including:

a first Si layer formed as a common substrate layer of the mirror part, the movable support part, the first piezoelectric actuators, and the second piezoelectric actuators, and in which cavities are formed on back sides of at least the second piezoelectric actuators except a back side of at least the movable support part, and a fourth SiO$_2$ layer with which sides of the cavities are covered.

According to the optical deflector of the present invention, the first Si layer is formed as a substrate layer common to the mirror part, the movable support part, the first piezoelectric actuators, and the second piezoelectric actuators, and the first Si layer has cavities on back sides of at least the second piezoelectric actuators except at least the back side of the movable support part. Then, the sides of the cavities are covered with the fourth SiO$_2$ layer. The fourth SiO$_2$ layer becomes proof that the optical deflector was manufactured from the Si wafer with the cavities enclosed therein.

BRIEF DESCRIPTION OF DRAWINGS

FIG. 2A is a table illustrating a relationship among SOI film thickness, resonance frequency in horizontal axial direction, and swing angle in vertical axial direction.

FIG. 2B is an experimental graph of examining a relationship between the SOI film thickness and the resonance frequency in the horizontal axial direction.

FIG. 2C is an experimental graph of examining the drive voltage of outside piezoelectric actuators and mechanical half angle by setting the SOI film thickness as a parameter.

DESCRIPTION OF EMBODIMENT

Figure 1:
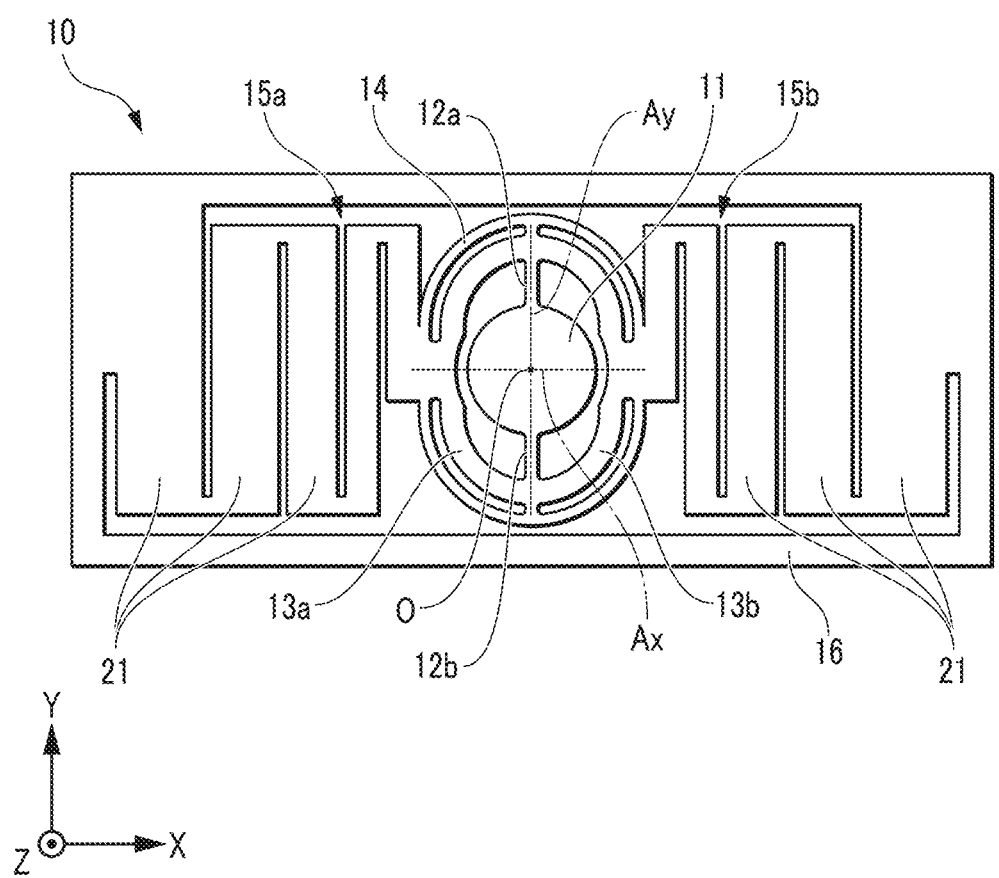
FIG. 1 is a front view of an optical deflector.

A preferred embodiment of the present invention will be described below. It is needless to say that the present invention is not limited to the embodiment below. The present invention can be carried out in various modes within the scope of technical concepts disclosed in this specification. Note that elements common to respective examples are given the same reference numerals.

The preferred embodiment of the present invention will be described in detail below. In the following description, a common reference numeral is used for substantially identical or equivalent elements and parts. Further, as for elements in a pair or a group having the same structure, reference numerals having the same number but different only in suffix alphabet letter are used. Further, when the elements that constitute the pair or the group are collectively called, such a reference numeral that omits each suffix letter is used.

(Optical Deflector (Whole))

FIG. 1 is a front view of an optical deflector 10. The optical deflector 10 is manufactured from a SOI (Silicon on Insulator) as MEMS (Micro Electro Mechanical Systems). The optical deflector 10 includes, as main elements, a mirror part 11, torsion bars 12a, 12b, inside piezoelectric actuators 13a, 13b, a movable frame part 14, outside piezoelectric actuators 15a, 15b, and a fixed frame part 16.

A three axis coordinate system consisting of X axis, Y axis, and Z axis is defined for convenience of describing the structure of the optical deflector 10. The X axis and the Y axis are defined as directions respectively parallel to the extension directions of the long side and the short side of the fixed frame part 16 that is a rectangle in front view. The Z axis is defined as a direction parallel to a thickness direction of the optical deflector 10.

O is the center of the mirror part 11. The center O is also the center of the optical deflector 10. Laser light or the like from an unillustrated light source is incident on the center O of the mirror part 11.

A rotation axis Ax and a rotation axis Ay as two rotation axes of the mirror part 11 are orthogonal to each other at the center O of the mirror part 11. When the mirror part 11 faces straight ahead, the rotation axis Ax and the rotation axis Ay are parallel to the X axis and the Y axis, respectively.

The mirror part 11 is located in the center of the optical deflector 10. The torsion bars 12a, 12b are extending from both sides of the mirror part 11 along the rotation axis Ay in the Y direction.

The inside piezoelectric actuators 13a, 13b are arranged on both sides of the mirror part 11 in the X axis direction, and each end thereof in the Y direction is joined to an intermediate portion of each of the torsion bars 12a, 12b, respectively. The inside piezoelectric actuators 13a, 13b are joined to each other at both ends in the Y axis direction to form an elliptical ring long in the Y axis direction as the entire pair so as to surround the mirror part 11.

The movable frame part 14 has an elliptical ring shape vertically long in the Y axis direction to surround the elliptical ring of the inside piezoelectric actuators 13a, 13b. Each torsion bar 12 is joined to the inner circumference of the movable frame part 14 at an end opposite to the side of the mirror part 11. Each torsion bar 12 is joined to the inner circumference of the movable frame part 14 on the outer circumference of the intermediate portion thereof in the Y axis direction.

The outside piezoelectric actuators 15a, 15b are arranged on both sides of the mirror part 11 in the X axis direction. Each outside piezoelectric actuator 15 is joined to the outer circumference of the movable frame part 14 and the inner periphery of the fixed frame part 16 in both end portions, respectively.

When the mirror part 11 faces straight ahead, a joint portion between the inside piezoelectric actuator 13 and the movable frame part 14, a joint portion between the movable frame part 14 and the outside piezoelectric actuator 15, and a joint portion between the outside piezoelectric actuator 15 and the fixed frame part 16 are lined up on a straight line passing through the center O and parallel to the X axis. The inside piezoelectric actuator 13 has an arc-shaped recess on the inner circumferential side on the straight line to increase the diameter of the round mirror part 11.

Each outside piezoelectric actuator 15 has plural piezoelectric cantilevers 21 coupled with each other in a meander pattern. The closer each piezoelectric cantilever 21 to the fixed frame part 16, the wider the width thereof becomes. Thus, the closer the piezoelectric cantilever 21 to the fixed frame part 16, the stronger the deformation force thereof, whereas the closer the piezoelectric cantilever 21 to the movable frame part 14, the higher the flexibility thereof becomes.

The inside piezoelectric actuators 13 and the outside piezoelectric actuators 15 receive drive voltages from an unillustrated drive device, respectively. The inside piezoelectric actuators 13 are interposed between the torsion bars 12 and the movable frame part 14 to torsionally vibrate the torsion bars 12 about a rotation axis Ay at a resonance frequency. This causes the mirror part 11 to turn reciprocally about the rotation axis Ay at a resonance frequency Fy.

It is assumed that the plural piezoelectric cantilevers 21 equipped in each outside piezoelectric actuator 15 are numbered, such as No. 1, No. 2, . . . , in order from the side of the fixed frame part 16 to the side of the movable frame part 14. In this case, odd-numbered piezoelectric cantilevers 21 and even-numbered piezoelectric cantilevers 21 receive, from the unillustrated drive device, drive voltages with same peak-to-peak but opposite in phase. As a result, the odd-numbered piezoelectric cantilevers 21 and the even-numbered piezoelectric cantilevers 21 are curved in phases opposite to each other.

Thus, the curve of each piezoelectric cantilever 21 is added to the outside piezoelectric actuator 15 to increase the amount or rotation of a leading end portion of the outside piezoelectric actuator 15 on the side of the movable frame part 14 relative to the base end portion thereof on the side of the fixed frame part 16. As a result, the outside piezoelectric actuator 15 causes the movable frame part 14 to turn reciprocally about a rotation axis parallel to the X axis by the increased amount of rotation on the leading end side at a non-resonant frequency Fx. This causes the mirror part 11 to turn reciprocally about the rotation axis Ax at the non-resonance frequency Fx. Note that non-resonant frequency Fx<resonance frequency Fy.

(Substrate Layer)

FIG. 2A illustrates a relationship among SOI film thickness, resonance frequency in horizontal axial direction, and swing angle in vertical axial direction. In FIG. 2A to FIG. 2C, the SOI film thickness means the thickness of an active layer 34 (FIG. 6 and the like) as a substrate layer of the optical deflector 10. The resonance in the horizontal axial direction (X axis direction) means reciprocal turning of the mirror part 11 about the rotation axis Ay. The swing angle in the vertical direction (Y axis direction) means a swing angle of the mirror part 11 about the rotation axis Ax.

It can be understood from FIG. 2A that the resonance frequency in the horizontal axial direction and the swing angle in the vertical axial direction have a trade-off relation upon setting the SOI film thickness.

FIG. 2B is an experimental graph of examining a relationship between SOI film thickness and resonance frequency in horizontal axial direction. It can be understood from FIG. 2B that the resonance frequency in the horizontal axial direction increases as the SOI film thickness increases.

FIG. 2C is an experimental graph of examining the drive voltage of the outside piezoelectric actuators 15 and mechanical half angle by setting the SOI film thickness as a parameter. The mechanical half angle is a swing angle to each side with respect to the front of the mirror part 11 without any damage such as to cut off the torsion bars 12 when each drive voltage is supplied to the mirror part 11 to cause reciprocal turning about the rotation axis Ax.

It can be understood from FIG. 2C that the mechanical half angle increases as the drive voltage increases or the SOI film thickness decreases.

(Abnormal Vibration)

FIGS. 3A to 3D contains stress distribution maps of examining various abnormal vibrations of the mirror part 11 by simulation. In FIGS. 3A to 3D, the whither the area, the higher the stress.

Figure 3A:
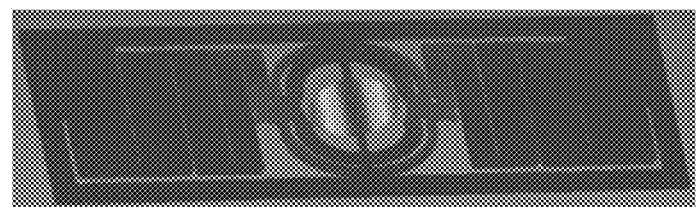
FIG. 3A to 3D contain stress distribution maps of examining various abnormal vibrations of a mirror part by simulation.
Figure 3B:
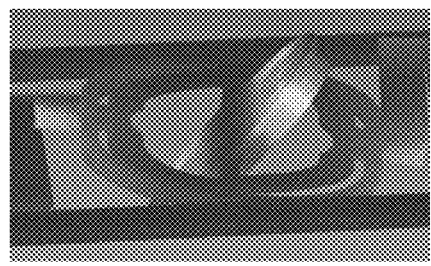

In FIG. 3A, an abnormality occurs in a mode in which the inside piezoelectric actuators 13 torsionally vibrate the torsion bars 12. FIG. 3B illustrates an enlarged area near the mirror part 11 at the time of the abnormality in the torsional vibration mode.

At the time of the abnormality in the torsional vibration mode, the influence on the movable frame part 14 received from the resonance vibration increases as the resonance frequency Fy increases. As a result, the movable frame part 14 cannot stand it and hence causes abnormal vibration.

As measures against the abnormal vibration as illustrated in FIG. 3A and FIG. 3B, increasing the rigidity of the movable frame part 14 or increasing a moment ratio to be described with reference to FIG. 4 can be considered.

Figure 3C:
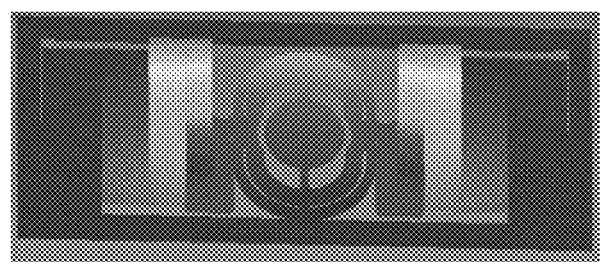
Figure 3D:
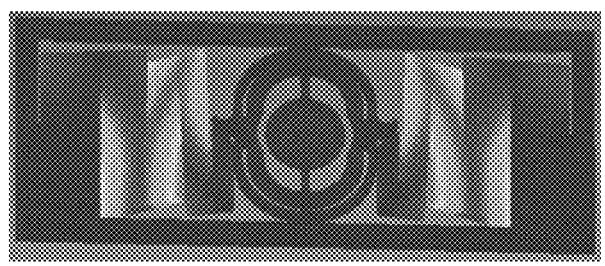

FIG. 3C and FIG. 3D illustrate abnormal vibrations of the outside piezoelectric actuators 15. In FIG. 3C, the outside piezoelectric actuators 15a, 15b are translationally moved to the +side of the Y axis direction and are colliding with the fixed frame part 16. In (d), the piezoelectric cantilevers 21 of each outside piezoelectric actuator 15 are inclined in front view.

One of the causes of the abnormal vibrations as in FIG. 3C and FIG. 3D is considered that, when the piezoelectric cantilevers 21 are made thinner to increase the swing angle about the rotation axis Ax, the rigidity of the piezoelectric cantilevers 21 is reduced, and hence it becomes difficult to transmit, to the movable frame part 14, the reciprocal turning force about the rotation axis parallel to the rotation axis Ax by the outside piezoelectric actuators 15.

As measures against the abnormal vibrations in FIG. 3C and FIG. 3D, reducing the weight of the movable elements on the inner circumferential side of the movable frame part 14 (that is, the mirror part 11, the torsion bars 12, and the inside piezoelectric actuators 13) can be considered.

(Inertia Moment Ratio)

Figure 4:
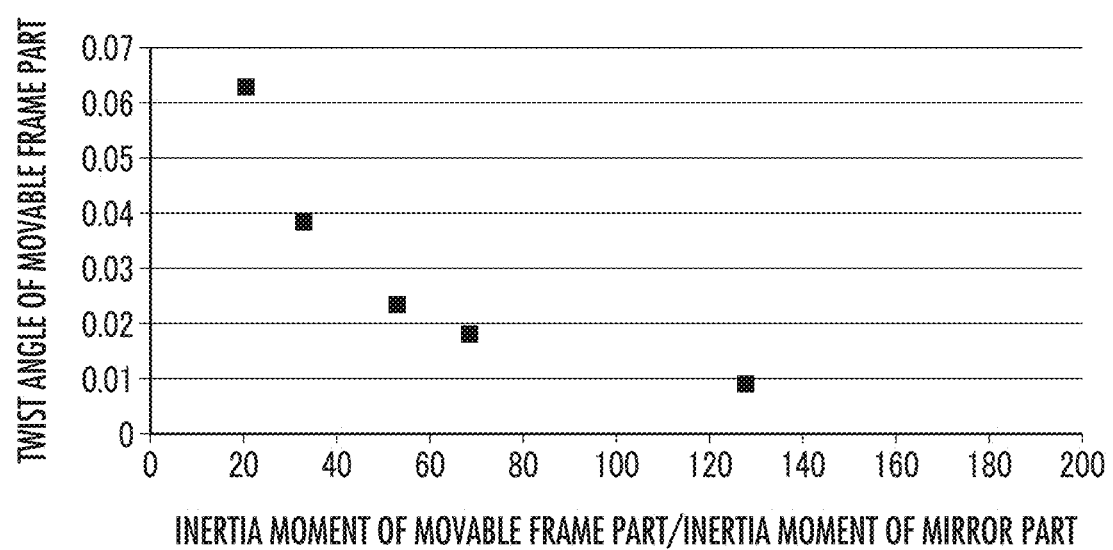
FIG. 4 is a graph of examining a relationship between an inertia moment ratio of a movable frame part to the mirror part and a twist angle of the movable frame part about a rotation axis Ay.

FIG. 4 is a graph of examining a relationship between the ratio of an inertia moment $I_i$ of the movable frame part 14 to an inertia moment $I_M$ of the mirror part 11 and the twist angle of the movable frame part 14 about the rotation axis Ay. The inertia moments $I_M$ and $I_i$ of the mirror part 11 and the movable frame part 14 are expressed respectively in Equations (1) and (2) below.

$$I_M = m_M r^2_M \quad (1):$$

$$I_i = m_i r^2_i \quad (2):$$

In the above equations, subscripts M and i denote the mirror part 11 (Mirror) and the movable frame part 14 (inner frame), respectively. m demotes mass. r is distance from the rotation axis Ay.

The inertia moment ratio on the horizontal axis of FIG. 4 indicates $I_i/I_M$. On the other hand, since a reaction caused by the reciprocal turning of the mirror part 11 about the rotation axis Ay occurs in the movable frame part 14, the movable frame part 14 reciprocally turns about the rotation axis Ay in a direction opposite to the mirror part 11. The twist angle on the vertical axis indicates the difference ratio of the turning angle of the movable frame part 14 to the turning angle of the mirror part 11 at this time. Twist angle=0 means that the same twist angle as the time when there is no reaction is maintained.

It is found from FIG. 4 that the twist angle of the movable frame part 14 approaches 0 as the inertia moment ratio $I_i/I_M$ increases. The abnormal vibration in the torsional vibration mode in FIG. 3A and FIG. 3B increases as the twist angle becomes larger.

(Manufacturing Method)

Figure 5:
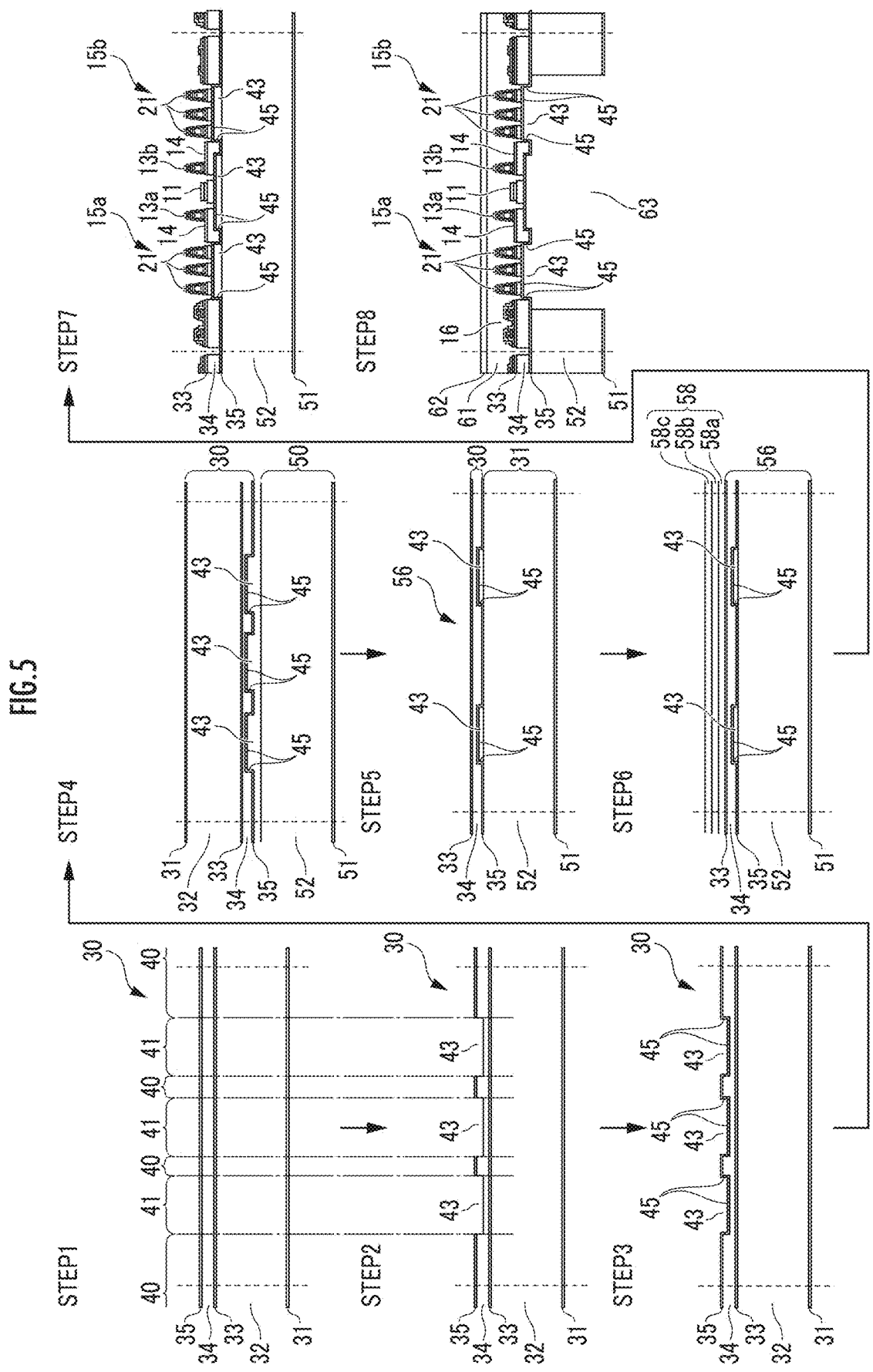
FIG. 5 is a diagram illustrating a manufacturing method for the optical deflector.

FIG. 5 is a diagram illustrating a manufacturing method for the optical deflector 10. The manufacturing method will be described in the order of processes.

In STEP1, an SOI wafer 30 is prepared. The SOI wafer 30 has a $SiO_2$ (silicon dioxide) layer 31, a support layer 32, a $SiO_2$ layer 33, the active layer 34, and a $SiO_2$ layer 35 in order from bottom (back side) to top (surface) in a lamination direction (=thickness direction). The support layer 32 and the active layer 34 are Si layers made of Si (silicon).

Further, in STEP, non-etching regions 40 and etching regions 41 are set on the surface of the SOI wafer 30. The non-etching regions 40 include at least forming regions of the movable frame part 14. The etching regions 41 include at least forming regions of the outside piezoelectric actuators 15.

In STEP2, etching is carried out on the etching regions 41 from the surface side of the SOI wafer 30. Thus, multiple cavities 43 are formed on the surface of the SOI wafer 30. Each of the cavities 43 has a bottom formed into a flat plane with an equal depth among the cavities 43, and opens to the side of the $SiO_2$ layer 35.

In STEP3, the SOI wafer 30 is exposed to a high-temperature atmosphere for a predetermined time to form a $SiO_2$ layer 45 on the exposed surface of the cavities 43. As a result, the surface side of the SOI wafer 30 is covered with the $SiO_2$ layer 35 in the non-etching regions 40, and covered with the $SiO_2$ layer 45 on the bottom and sides of each of the cavities 43. Thus, consecutive SiO$_2$ layers on the surface of the SOI wafer 30 are covered with the SiO$_2$ layer 35 and the SiO$_2$ layer 45.

In STEP4, the SOI wafer 30 is turned upside down and an SOI wafer 50 is prepared. As a result of turning the SOI wafer 30 upside down, the SiO$_2$ layer 31 becomes the surface and the SiO$_2$ layer 35 becomes the back side. The SOI wafer 50 has a SiO$_2$ layer 51 and a support layer 52. Further, the SiO$_2$ layer 35 of the SOI wafer 30 and the support layer 52 of the SOI wafer 50 are aligned.

The SOI wafer 50 may also be manufactured by removing a Box layer and an active layer from an SOI wafer including a support layer and the active layer as Si layers on both sides of a SiO$_2$ layer as the BOX layer. In this case, the remaining support layer and a SiO$_2$ layer below the support layer become the support layer 52 and the SiO$_2$ layer 51, respectively.

In STEP5, the SOI wafer 30 and the SOI wafer 50 are joined under a high-temperature atmosphere in the state where the SiO$_2$ layer 35 of the SOI wafer 30 and the support layer 52 of the SOI wafer 50 are aligned in STEP4. Thus, an SOI wafer 56 is manufactured.

Gas used for the high-temperature atmosphere in STEP5 is, for example, (a) hydrogen, (b) Ar (argon), or (c) a mixed gas of hydrogen and Ar. Further, a high-temperature atmosphere holding temperature is not lower than 900° C. and not higher than 1200° C. After the SOI wafer 30 and the SOI wafer 50 are joined, the SiO$_2$ layer 31 and the support layer 32 on the surface side of the joined body are removed to complete the SOI wafer 56.

The cavities 43 are enclosed inside the SOI wafer 56. In the SOI wafer 56, the surface is the SiO$_2$ layer 33 and the back side is the SiO$_2$ layer 51. In a laminated structure of the SOI wafer 56, the SiO$_2$ layer 51, the support layer 52, the SiO$_2$ layer 35, the active layer 34, and the SiO$_2$ layer 33 are lined up in order from the back side to the surface side in the thickness direction.

In STEP6, upper structural layers 58 of piezoelectric actuators are formed on the surface of the SiO$_2$ layer 33 as the surface of the SOI wafer 56 in STEP5. The upper structural layers 58 include at least a lower electrode layer 58a, a PZT(Pb(Zr·Ti)O$_3$ layer 58b, and an upper electrode layer 58c in order upward from the surface of the SiO$_2$ layer 33.

The bottom of each of the cavities 43 is formed by etching, whereas the SiO$_2$ layer 33 is included in the SOI wafer 30 from the beginning. Therefore, unprocessed upper structural layers 58 are formed on the surface of the SiO$_2$ layer 33 which is flat with almost no unevenness, that is, which can ignore the surface roughness. As a result, each layer included in the upper structural layers 58 has a uniform film thickness over the entire surface of the SiO$_2$ layer 33.

In STEP7, the SiO$_2$ layer 35 is used as a stop layer for the SOI wafer 56 to carry out etching from the side of the upper structural layers 58 at a depth that reaches the surface of the SiO$_2$ layer 35. Thus, movable elements of the optical deflector 10 (where elements on the inner circumferential side of the fixed frame part 16 are all movable elements) are manufactured. However, since the SiO$_2$ layer 35 is still remaining, the movable elements are combined by the SiO$_2$ layer 35 and the displacement thereof is constrained.

In a process (not illustrated) on the way from STEP7 to STEP8, electrode pads 69 (FIG. 6), and an interlayer film 80, a wiring layer 81, and an insulating layer 82 (FIG. 7) are completed. Thus, the upper structure of the optical deflector 10 is all completed before next STEP8.

In STEP8, a wax layer 61 is formed on the surface of the SOI wafer 56 to make the movable elements buried. Further, a plate 62 is fixed to the surface of the wax layer 61. The wax layer 61 and the plate 62 fix the movable elements when etching the back side of the SOI wafer 56 in order to protect from damage.

In STEP8, after the wax layer 61 and the plate 62 are added, a recess 63 is further formed by etching the SOI wafer 56 from the back side thereof. The recess 63 is formed on the inner circumferential side of the fixed frame part 16 as displacement-allowing space when the movable elements are displaced to the back side upon operating the optical deflector 10 after completion of the optical deflector 10. Note that the recess 63 penetrates through the support layer 52.

Since the depth of the recess 63 is deep, anisotropic etching is more preferable than isotropic etching as the etching for forming the recess 63. Further, it may be either one of dry and wet etchings. This is because that the movable elements are completely buried inside the wax layer 61 and hence the movable elements never get wet.

(Trace)

Figure 6:
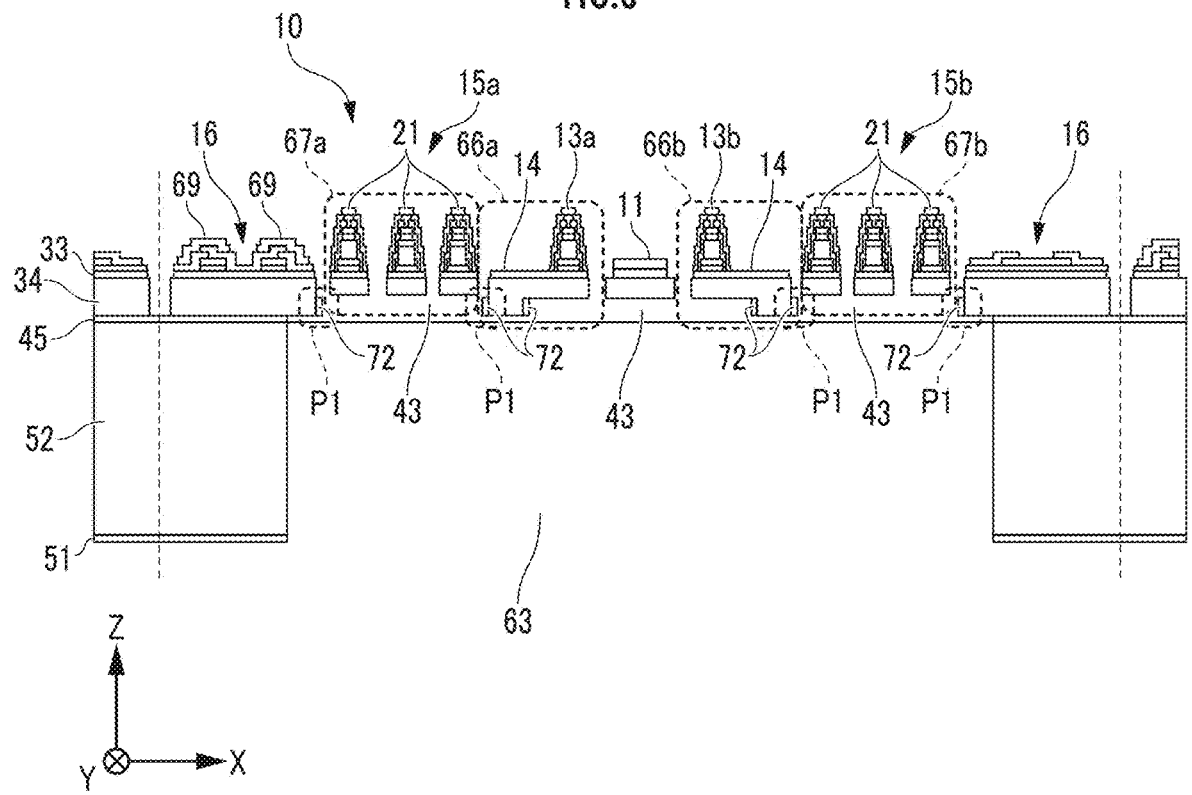
FIG. 6 is a sectional view of the optical deflector completed through processes in FIG. 5.

FIG. 6 is a sectional view of the optical deflector 10 completed through the processes in FIG. 5. Between STEP8 of FIG. 5 and FIG. 6, an etching process of the SiO$_2$ layer 35 and the SiO$_2$ layer 45 exposed to the recess 63 and a subsequent process of removing the wax layer 61 are included.

In the etching process of the SiO$_2$ layer 35 and the SiO$_2$ layer 45, the SiO$_2$ layer 35 and the SiO$_2$ layer 45 exposed to the recess 63 are etched off by an amount corresponding to the thickness of the SiO$_2$ layer 45 on the bottom of the cavities 43 in the thickness direction of the active layer 34 uniformly regardless of the location. Thus, all the surfaces of the SiO$_2$ layers with the layer surfaces parallel to the back side of the SOI wafer 56 among surfaces exposed to the recess 63 (all the exposed surfaces of the SiO$_2$ layer 35 and the SiO$_2$ layer 45 covering the bottom of the cavities 43 among the surfaces of the SiO$_2$ layer 45) are removed.

On the other hand, the SiO$_2$ layer 45 on the sides of the cavities 43 as the SiO$_2$ layer with the layer surface parallel to the depth direction of the SOI wafer 56 among the surfaces exposed to the recess 63 has a sufficient length in the depth direction. As a result, only part of the back side of the SOI wafer 56 is etched off without removing all the parts, and remaining parts of the SiO$_2$ layer 45 (SiO$_2$ layer 45 at positions P1) on the sides of the cavities 43 remain as traces 72 after the etching process.

After the etching process, the movable elements mutually combined by the SiO$_2$ layer 45 are released. Further, the traces 72 becomes proof that the optical deflector 10 was manufactured on the SOI wafer 56 with the cavities 43. This is because, if the optical deflector 10 was manufactured on an SOI wafer without cavities 43, rather than on the SOI wafer 56 with the cavities 43, the recess formed on the back side of the active layer 34 would not be covered with SiO$_2$ to make the active layer 34 as the substrate layer in the regions of the outside piezoelectric actuators 15 thinner.

(Examples/Common Points)

FIG. 7 to FIG. 11 are sectional views of optical deflectors 10a to 10e as various examples of the optical deflector 10. Note that since the main part of the optical deflector 10 is left-right symmetric in front view, only the left-half section of a center line Ce of the optical deflector 10 is illustrated in these sectional views. Further, since SiO$_2$ layers such as the SiO$_2$ layers 33, 35 and SiO$_2$ layers 45, 51 are thin, illustration thereof is omitted. However, the SiO$_2$ layer 35 is illustrated without being omitted only in FIG. 11. The reason will be described later.

In FIG. 7 to FIG. 11, 80 denotes the interlayer film, 81 denotes the wiring layer, 82 denotes the insulating layer, and 84 denotes a reflective layer made of, for example, a metal film that forms a reflective surface of the mirror part 11. These are all elements known in the piezoelectric optical deflector 10. As for the cavities 43, a cavity 43 positioned more inward than the movable frame part 14 (on the side of the center O) is indicated as a cavity 43$i$, and a cavity 43 positioned more outward than the movable frame part 14 (on the other side of the center O) is indicated as a cavity 43$o$. As a matter of course, the cavity 43$i$ and the cavity 43$o$ belong to the etching regions 41 (FIG. 5/STEP1).

Note that illustration of the torsion bars 12 is omitted in FIG. 7 to FIG. 11. However, the thickness of the torsion bars 12 in the active layer 34 is set equal to the thickness of the mirror part 11 in all examples.

The optical deflectors 10$a$ to 10$e$ have common features below.

(a) The movable frame part 14 belongs to the non-etching regions 40. Thus, I$_i$/I$_M$ as the inertia moment ratio described above increases to suppress abnormal vibrations described with reference to FIG. 3A to FIG. 3D. (b) The outside piezoelectric actuators 15 belong to the etching regions 41 and have the cavities 43 on the back side of the active layer 34. Thus, the flexibility of the piezoelectric cantilevers 21 increase to increase the swing angle of the mirror part 11 about the rotation axis Ax.

Example 1

Figure 7:
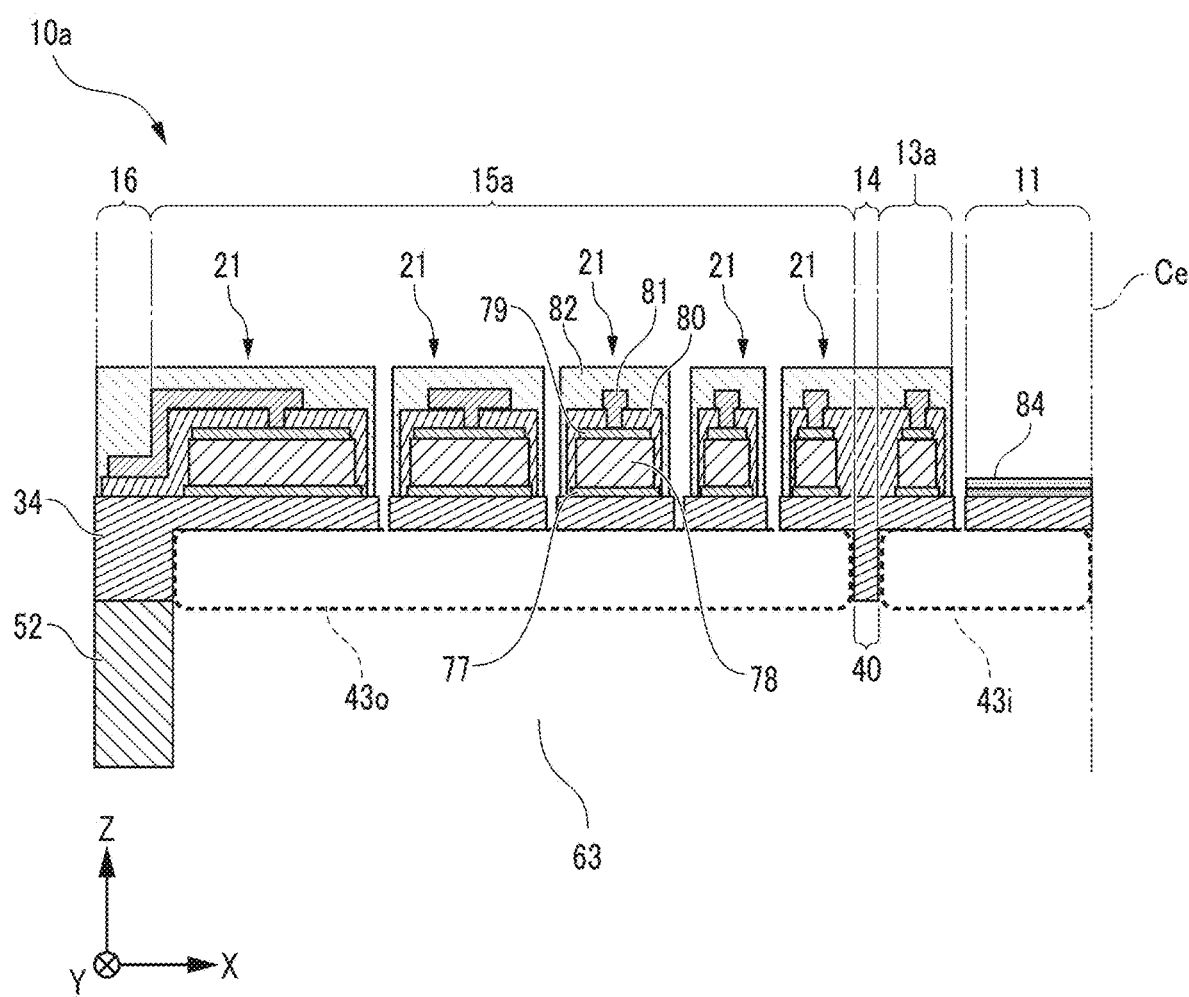
FIG. 7 is a sectional view of a first example of the optical deflector.

In the optical deflector 10$a$ of FIG. 7, only the forming regions of the movable frame part 14 among the movable elements are set in the non-etching regions 40. As a result, in the active layer 34, the cavity 43$i$ is formed on the back side of the mirror part 11 and the torsion bars 12, and the cavity 43$o$ is formed on the back side of the outside piezoelectric actuators 15.

In the optical deflector 10$a$, since the mirror part 11 becomes lightweight, I$_i$/I$_M$ as the inertia moment ratio further increases to increase the effect of suppressing abnormal vibration.

Example 2

Figure 8:
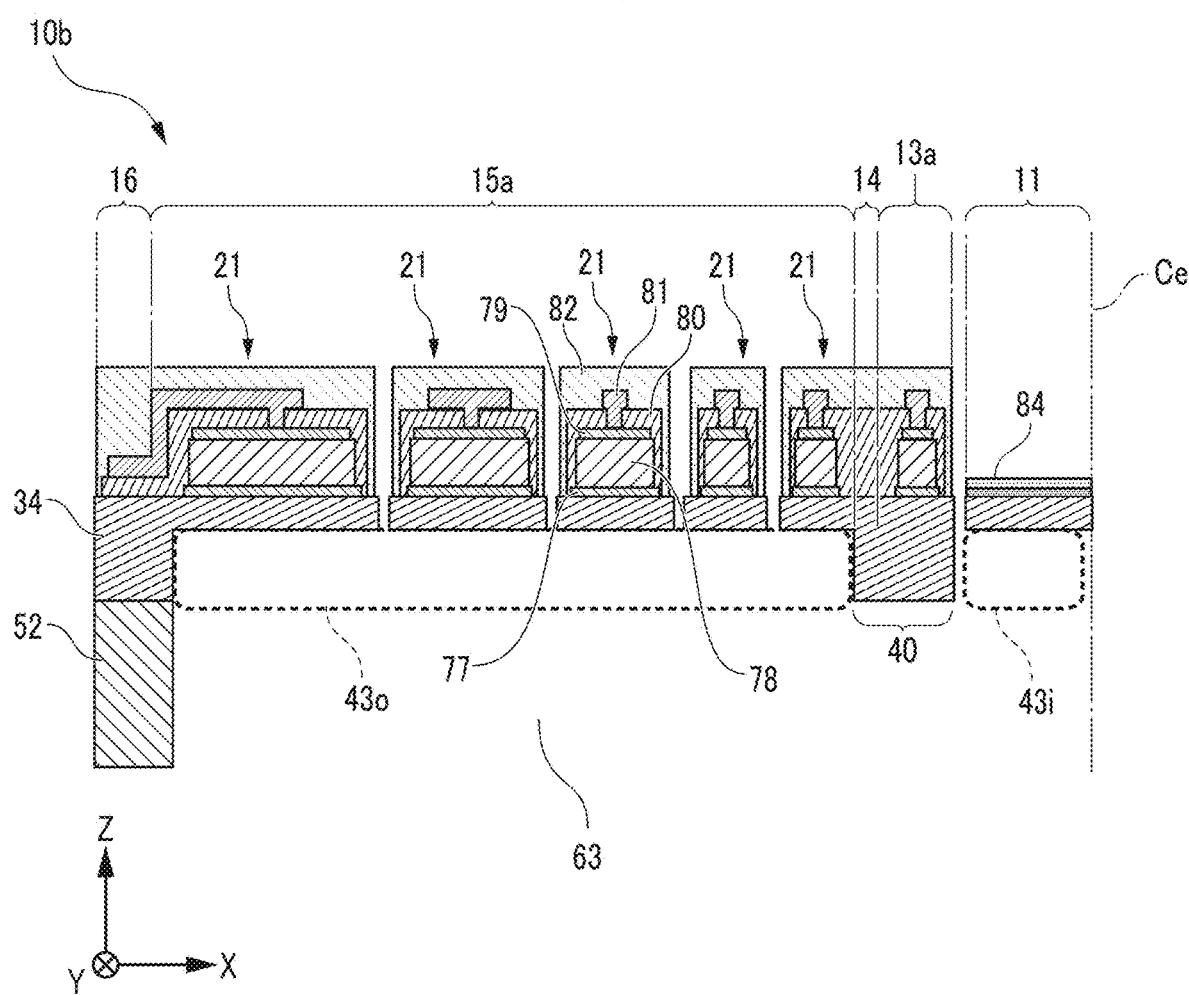
FIG. 8 is a sectional view of a second example of the optical deflector.

In the optical deflector 10$b$ of FIG. 8, the forming regions of the inside piezoelectric actuators 13 and the movable frame part 14 among the movable elements are set in the non-etching regions 40. As a result, in the active layer 34, the cavity 43$i$ is formed on the back side of the mirror part 11 and the cavity 43$o$ is formed on the back side of the outside piezoelectric actuator 15.

Thus, in the optical deflector 10$b$, the swing angle of the optical deflector 10 about the rotation axis Ax increases. Further, since the mirror part 11 becomes lightweight, I$_i$/I$_M$ further increases to increase the effect of suppressing abnormal vibration.

Example 3

Figure 9:
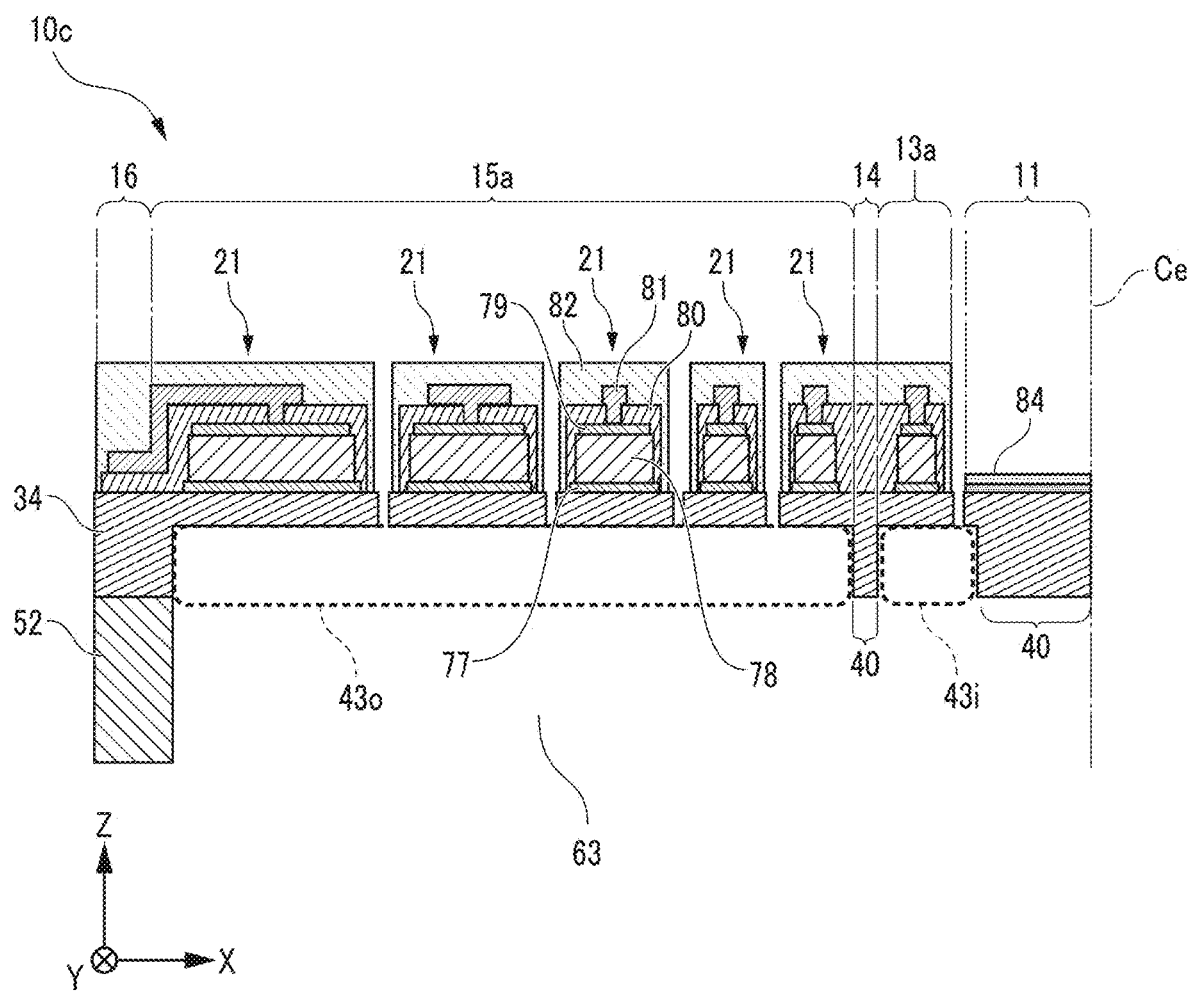
FIG. 9 is a sectional view of a third example of the optical deflector.

In the optical deflector 10$c$ of FIG. 9, the forming regions of the mirror part 11 and the movable frame part 14 among the movable elements are set in the non-etching regions 40. As a result, in the active layer 34, the cavity 43$i$ is formed on the back side of the inside piezoelectric actuators 13 and the cavity 43$o$ is formed on the back side of the outside piezoelectric actuators 15.

In the optical deflector 10$c$, since four parts of the inside piezoelectric actuators 13 become lightweight, the rigidity of the movable frame part 14 relatively increases to increase the effect of suppressing abnormal vibrations in FIG. 3C and FIG. 3D.

Example 4

Figure 10:
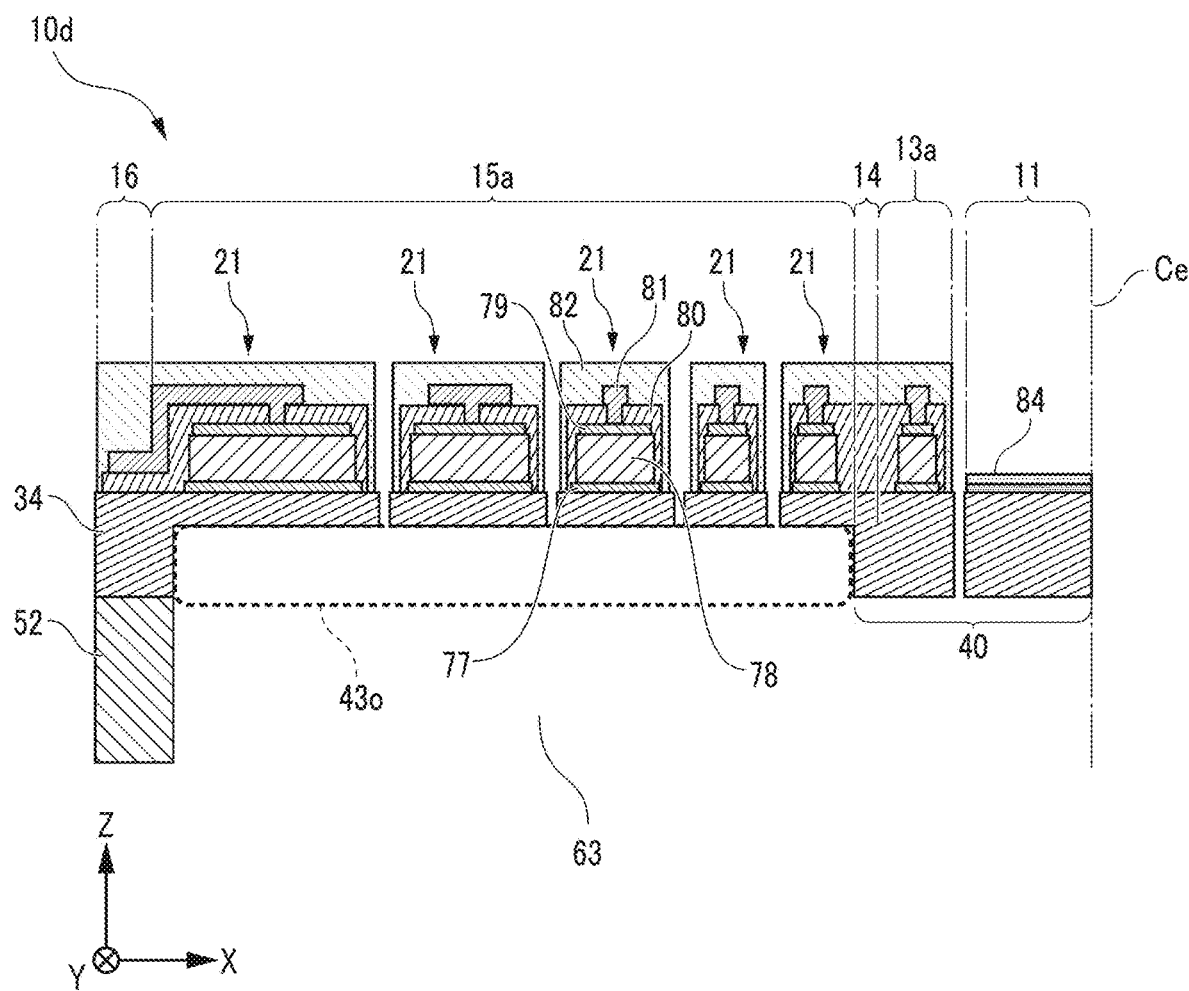
FIG. 10 is a sectional view of a fourth example of the optical deflector.

In the optical deflector 10$d$ of FIG. 10, the forming regions of the mirror part 11, the torsion bars 12, and the movable frame part 14 among the movable elements are set in the non-etching regions 40. As a result, the resonance frequency Fy about the rotation axis Ay further increases.

Example 5

Figure 11:
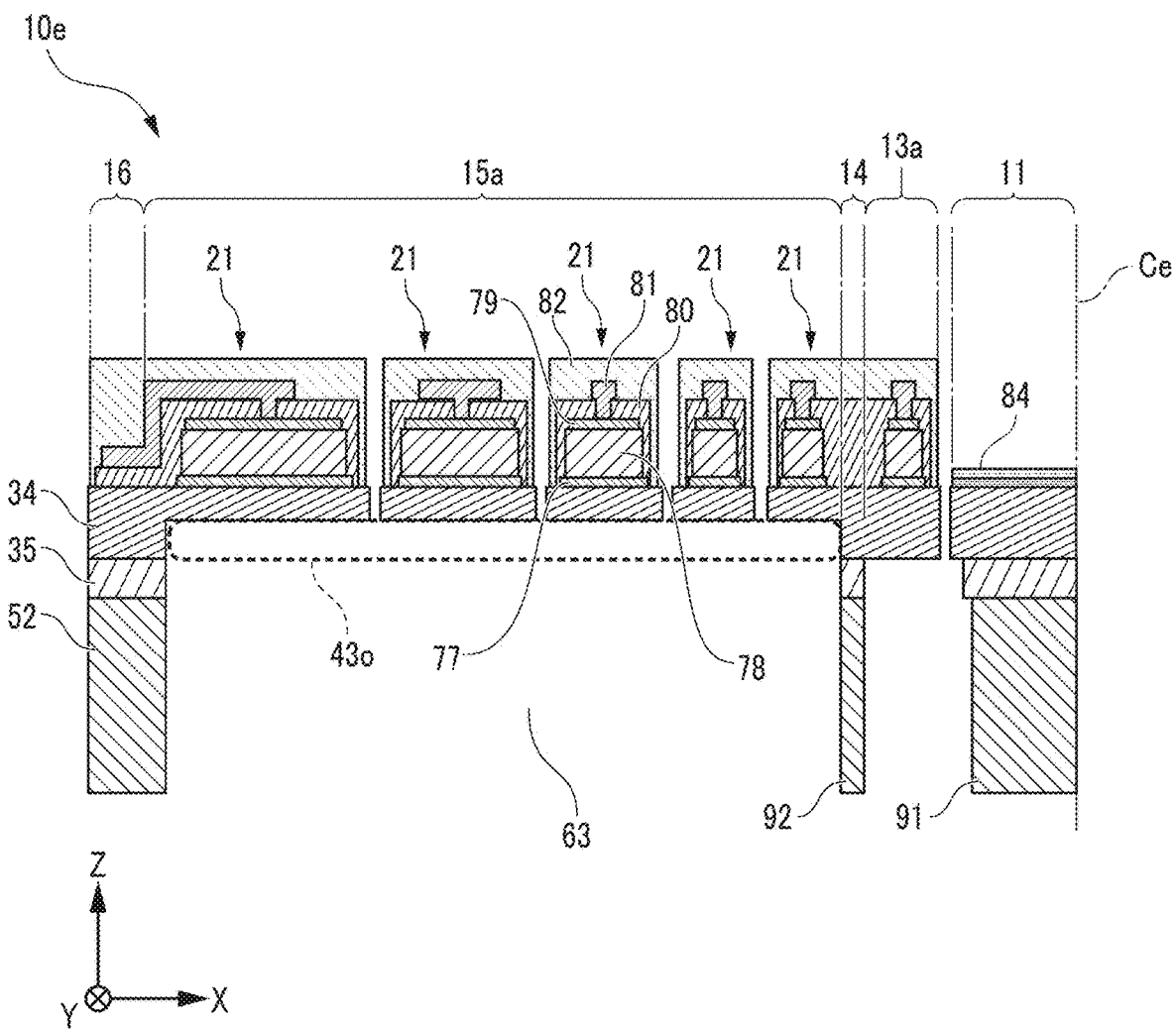
FIG. 11 is a sectional view of a fifth example of the optical deflector.

In the optical deflector 10$e$ of FIG. 11, ribs 91 and 92 are added to the optical deflector 10$c$ of FIG. 9 on the back sides of the mirror part 11 and the movable frame part 14, respectively. The ribs 91 and 92 are joined to the back sides of the mirror part 11 and the movable frame part 14, respectively, through the SiO$_2$ layer 35. In other words, the ribs 91 and 92 are formed by being left as non-etched portions of the support layer 52 upon forming the recess 63.

The rib 91 increases the rigidity of the mirror part 11. As a result, the mirror surface of the mirror part 11 is prevented from being distorted during reciprocal turning. The rib 92 further increases the rigidity of the movable frame part 14. Thus, the effect of preventing the abnormal vibration of the mirror part 11 as described with reference to FIG. 3A and FIG. 3B increases.

(Modifications and Supplements)

The SOI wafer is also a Si wafer. Therefore, a first Si wafer of the present invention includes an SOI wafer. In the embodiment, the SOI wafer 56 is manufactured from two SOI wafers (the SOI wafers 30, 50). Both or either one of the first Si wafer and a second Si wafer used to manufacture a third Si wafer of the present invention may also be of bare silicon.

A first SiO$_2$ layer, a second Si layer, and a third SiO$_2$ layer of the present invention correspond to the SiO$_2$ layer 33, the active layer 34, and the SiO$_2$ layer 35 of the embodiment. The third SiO$_2$ layer of the present invention corresponds to the SiO$_2$ layer 45. A fourth SiO$_2$ layer and the second Si layer of the present invention correspond to the SiO$_2$ layer 51 and the support layer 52, respectively.

In the embodiment, the upper structural layers 58 include the PZT layer 58$b$. A piezoelectric film layer included in a laminated structure layer of piezoelectric actuators of the present invention can also be made of a material other than PZT.

A movable support part and a fixed support part of the present invention correspond to the movable frame part 14 and the fixed frame part 16 of the embodiment, respectively. The movable support part and the fixed support part of the present invention do not have to be frame shapes.

In the embodiment, the rotation axis Ay as a first rotation axis and the rotation axis Ax as a second rotation axis are orthogonal to each other. However, the first rotation axis and the second rotation axis of the present invention do not have to be orthogonal to each other as long as they intersect each other.

The inside piezoelectric actuator 13 and the outside piezoelectric actuators 15 of the embodiment correspond to first piezoelectric actuators and second piezoelectric actuators of the present invention, respectively. The first piezoelectric actuators of the present invention do not have to have a semi-elliptical ring shape, and may be straight line-shaped cantilevers. The second piezoelectric actuators of the present invention are not limited to the structure in which the plural piezoelectric cantilevers 21 are coupled with each other in a meander pattern.

DESCRIPTION OF REFERENCE NUMERALS

10 . . . optical deflector, 11 . . . mirror part, 12 . . . torsion bar, 13 . . . inside piezoelectric actuator (first piezoelectric actuator), 14 . . . movable frame part (movable support part), 15 . . . outside piezoelectric actuator, 16 . . . fixed frame part (fixed support part), 30 . . . SOI wafer (first Si wafer), 33 . . . $SiO_2$ layer (first $SiO_2$ layer), 34 . . . active layer (first Si layer), 35 . . . $SiO_2$ layer (second $SiO_2$ layer), 40 . . . non-etching regions, 41 . . . etching regions, 43 . . . cavities, 45 . . . $SiO_2$ layer (third $SiO_2$ layer), 50 . . . SOI wafer (second Si wafer), 51 . . . $SiO_2$ layer (fourth $SiO_2$ layer), 52 . . . support layer (second Si layer), 56 . . . SOI wafer (third Si wafer), 58a . . . lower electrode layer, 58b . . . PZT layer, 58c . . . upper electrode layer, 63 . . . recess, 72 . . . trace, 91, 92 . . . rib.

The invention claimed is:

1. A manufacturing method for manufacturing an optical deflector including a mirror part, a movable support part, a fixed support part, first piezoelectric actuators interposed between the mirror part and the movable support part to turn the mirror part reciprocally about a first rotation axis at a resonance frequency, and second piezoelectric actuators interposed between the movable support part and the fixed support part to turn the mirror part reciprocally about a second rotation axis intersecting the first rotation axis at a non-resonant frequency lower than the resonance frequency, the manufacturing method comprising:

a first process in which etching regions and non-etching regions are set on a surface of a first Si wafer on a second SiO2 side, where the first Si wafer has a laminated structure in which a first SiO2 layer, a first Si layer, and a second SiO2 layer are arranged in order in a thickness direction, at least forming regions of the second piezoelectric actuators are included in the etching regions, at least forming regions of the movable support part are included in the non-etching regions, and etching is carried out only on the etching regions of the first Si wafer from the second SiO2 side to form cavities in the first Si layer to open to the second SiO2 side;

a second process of covering an exposed surface of the cavities with a third SiO2 layer;

a third process in which a surface of a second Si wafer on a second Si layer side, where the second Si wafer has a laminated structure of a fourth SiO2 layer and the second Si layer in the thickness direction, is joined to the surface of the first Si wafer on the second SiO2 layer side to form a third Si wafer with the cavities enclosed therein;

a fourth process of laminating a lower electrode layer, a piezoelectric film layer, and an upper electrode layer in order over an entire surface of the third Si wafer on the first SiO2 layer side as a laminated structure layer of piezoelectric actuators;

a fifth process in which anisotropic dry etching is carried out from a surface side of the third Si wafer to a depth of reaching the surface side of the second SiO2 layer to form the first piezoelectric actuators and the second piezoelectric actuators;

a sixth process in which etching is carried out from a back side of the third Si wafer to a depth of reaching a back side of the second SiO2 layer to form, on the back side of the third Si wafer, a recess surrounded by an inner wall of the fixed support part; and a seventh process in which anisotropic dry etching is carried out from the back side of the third Si wafer in a depth direction of the recess to remove the second SiO2 layer and the third SiO2 layer.

2. The manufacturing method according to claim 1, wherein a forming region of the mirror part and forming regions of the first piezoelectric actuators are included in the etching regions in the first process.

3. The manufacturing method according to claim 1, wherein in the first process, a forming region of the mirror part is included in the etching regions, and forming regions of the first piezoelectric actuators are included in the non-etching regions.

4. The manufacturing method according to claim 1, wherein in the first process, forming regions of the first piezoelectric actuators are included in the etching regions, and a forming region of the mirror part is included in the non-etching regions.

5. The manufacturing method according to claim 1, wherein a forming region of the mirror part and forming regions of the first piezoelectric actuators are included in the non-etching regions in the first process.

6. The manufacturing method according to claim 5, wherein the sixth process includes etching, after the fifth process, from the back side of the third Si wafer by excluding at least rib forming regions of the mirror part and the movable support part to form ribs of the second Si layer on back sides of the mirror part and the movable support part.

7. An optical deflector manufactured by the manufacturing method according to claim 1, the optical deflector including the mirror part, the movable support part, the first piezoelectric actuators, the fixed support part, and the second piezoelectric actuators, and the optical deflector comprising:

the second Si layer, which is formed as a common substrate layer of the mirror part, the movable support part, the first piezoelectric actuators, and the second piezoelectric actuators, and in which the cavities are formed on back sides of at least the second piezoelectric actuators except a back side of at least the movable support part, and the third SiO2 layer, with which sides of the cavities are covered.

* * * * *